(12) United States Patent
Yagi

(10) Patent No.: US 12,506,481 B2
(45) Date of Patent: Dec. 23, 2025

(54) SEMICONDUCTOR INTEGRATED CIRCUIT, TRANSMITTER, AND SEMICONDUCTOR DEVICE

(71) Applicant: Kioxia Corporation, Tokyo (JP)

(72) Inventor: Toshihiro Yagi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 102 days.

(21) Appl. No.: 18/460,086

(22) Filed: Sep. 1, 2023

(65) Prior Publication Data

US 2024/0106348 A1 Mar. 28, 2024

(30) Foreign Application Priority Data

Sep. 22, 2022 (JP) ................................. 2022-151262

(51) Int. Cl.
*H03K 19/0185* (2006.01)

(52) U.S. Cl.
CPC ............. *H03K 19/018528* (2013.01); *H03K 19/018521* (2013.01)

(58) Field of Classification Search
CPC ... H03K 19/018514–018528; H03K 19/01855
See application file for complete search history.

(56) References Cited

U.S. PATENT DOCUMENTS

| 7,112,996 B2* | 9/2006 | Lee ................... H03K 3/356113 326/82 |
| 8,400,184 B2 | 3/2013 | Dono et al. |
| 10,560,084 B2 | 2/2020 | Yagi |
| 11,515,877 B2 | 11/2022 | Yagi |
| 2021/0152160 A1 | 5/2021 | Feiz Zarrin Ghalam et al. |

FOREIGN PATENT DOCUMENTS

| JP | 5599993 B2 | 10/2014 |
| JP | 2019-050550 A | 3/2019 |

* cited by examiner

*Primary Examiner* — Patrick O Neill
(74) *Attorney, Agent, or Firm* — Kim & Stewart LLP

(57) ABSTRACT

A semiconductor integrated circuit includes a front stage circuit and a rear stage circuit. The rear stage circuit includes first, second, fifth, and sixth transistors and a plurality of seventh transistors. The front stage circuit includes first and second inverters and third and fourth transistors. The third transistor is between the first inverter and the rear stage circuit, and has a gate connected to a first power supply node. The fourth transistor is between the second inverter and the rear stage circuit, and has a gate connected to the first power supply node. A breakdown voltage of each of the third and fourth transistors in the front stage circuit is lower than that of the first, second, fifth, sixth, and seventh transistors in the rear stage circuit.

9 Claims, 11 Drawing Sheets

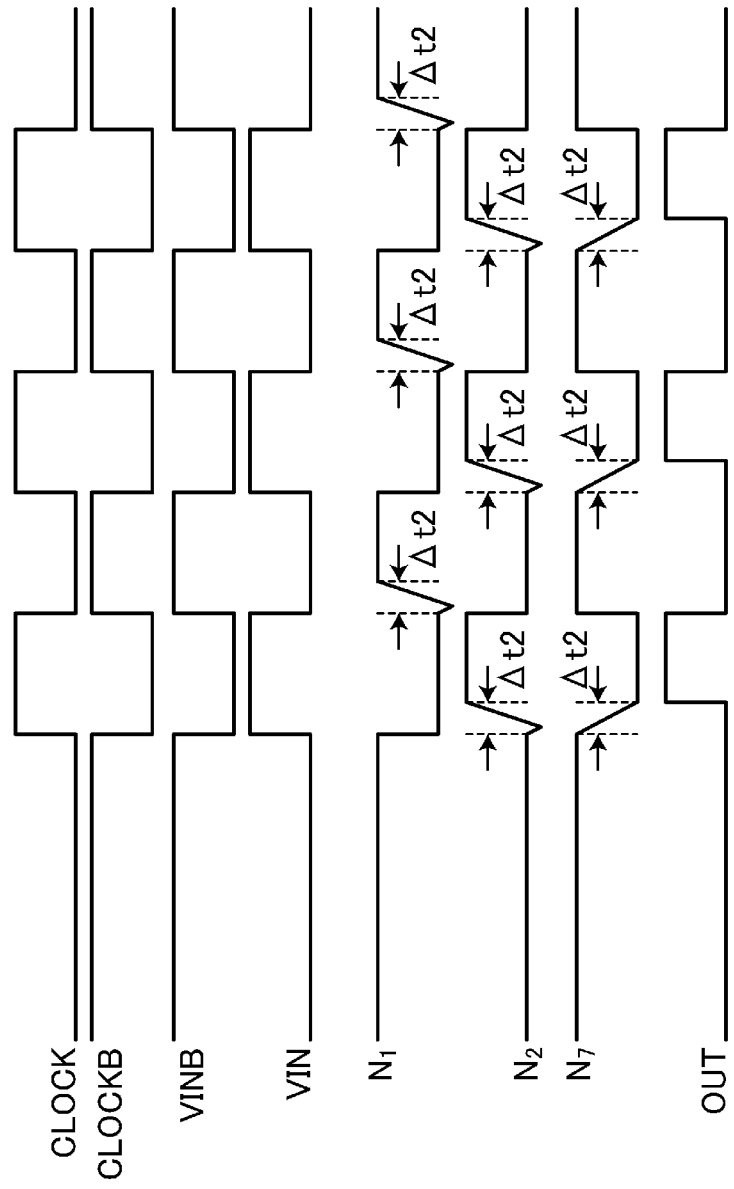

SEMICONDUCTOR INTEGRATED CIRCUIT, TRANSMITTER, AND SEMICONDUCTOR DEVICE

CROSS-REFERENCE TO RELATED APPLICATION

This application is based upon and claims the benefit of priority from Japanese Patent Application No. 2022-151262, filed Sep. 22, 2022, the entire contents of which are incorporated herein by reference.

FIELD

Embodiments described herein relate generally to a semiconductor integrated circuit, a transmitter, and a semiconductor device.

BACKGROUND

A transmitter of one type includes a semiconductor integrated circuit therein. The transmitter transmits data or a clock signal to a receiver. It is known that the duty ratio of the transmitted data or clock signal is related to the reception performance of the receiver. It is desirable that the duty ratio of the data or clock signal output by the transmitter is appropriate.

BRIEF DESCRIPTION OF THE DRAWINGS

FIG. 11 is a waveform diagram illustrating an operation of the semiconductor integrated circuit according to the second comparative example.

DETAILED DESCRIPTION

Embodiments provide a semiconductor integrated circuit, a transmitter, and a semiconductor device that can improve duty ratio variation.

In general, according to an embodiment, a semiconductor integrated circuit includes first and second inverters and first through seventh transistors. The first inverter is between a first power supply node at a first power supply voltage and a reference node at a reference voltage, and has a first input node configured to receive a first signal. The second inverter is between the first power supply node and the reference node, and has a second input node configured to receive a second signal, which is an inverted signal of the first signal. The first transistor is between a second power supply node at a second power supply voltage higher than the first power supply voltage and a first node. The second transistor is between the second power supply node and a second node. A drain of the second transistor is connected to a gate of the first transistor and a gate of the second transistor is connected to a drain of the first transistor. The third transistor is between the first node and the first inverter, and has a gate connected to the first power supply node. The fourth transistor is between the second node and the second inverter, and has a gate connected to the first power supply node. The fifth transistor is between the first node and the third transistor, and has a gate connected to the second power supply node. The sixth transistor is between the second node and the fourth transistor, and has a gate connected to the second power supply node. A plurality of seventh transistors is connected in series between a third node between the third and fifth transistors and a fourth node between the fourth and sixth transistors. Each of the seventh transistors has a gate configured to receive a signal at a third voltage. A breakdown voltage of each of the third and fourth transistors is lower than that of the first, second, fifth, sixth, and seventh transistors.

The semiconductor integrated circuits according to embodiments are described in detail with reference to the accompanying drawings below. The present disclosure is not limited by these embodiments.

First Embodiment

Figure 1:
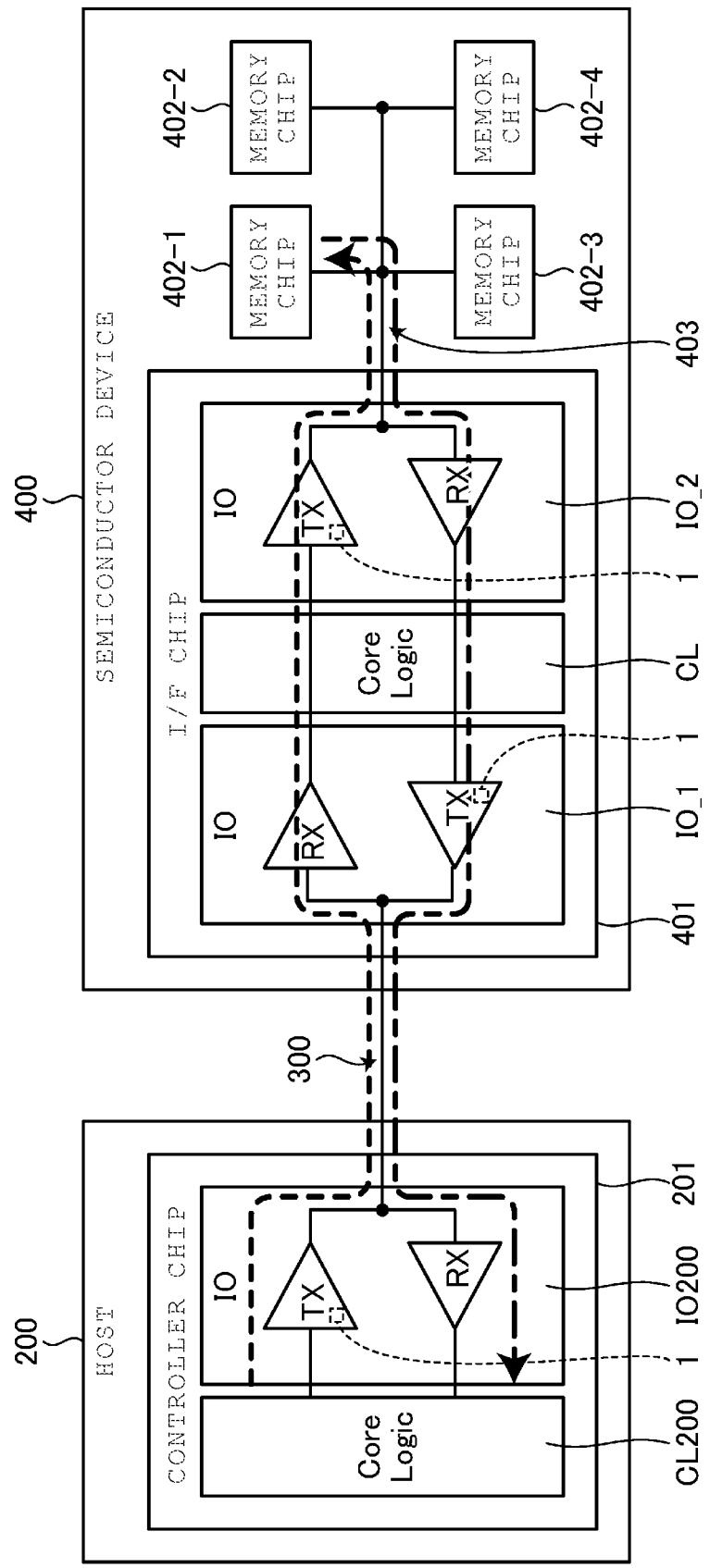
FIG. 1 is a diagram illustrating a configuration of a semiconductor device that includes a transmitter including a semiconductor integrated circuit according to a first embodiment.

A semiconductor integrated circuit according to a first embodiment can be used, for example, in a transmitter that outputs data or a clock signal. The semiconductor integrated circuit according to the first embodiment is directed to improving the variation in the duty ratio of the transmitted data or clock signal. A transmitter TX including a semiconductor integrated circuit 1 is applied to a semiconductor device 400 as illustrated in FIG. 1.

The semiconductor device 400 is connectable to a host 200 via a transmission line 300 and functions as a storage medium with respect to the host 200.

The semiconductor device 400 includes an interface (I/F) chip 401 and a plurality of memory chips 402-1 to 402-4. The transmission line 300 is connected to the I/F chip 401. The I/F chip 401 and the plurality of memory chips 402-1 to 402-4 are connected via a package (PKG) wiring 403. The I/F chip 401 includes the transmitter TX and a receiver RX. The transmitter TX includes the semiconductor integrated circuit 1.

The I/F chip 401 performs processing related to relaying data transmitted and received via the transmission line 300 and data transmitted and received via the PKG wiring 403.

The plurality of memory chips 402-1 to 402-4 are examples of electronic components. The PKG wiring 403 is a bus.

The I/F chip 401 includes an input and output circuit IO_1, a core logic circuit CL, and an input and output circuit IO_2. The input and output circuit IO_1 includes a transmitter TX and a receiver RX that are connected in parallel between the transmission line 300 and the core logic circuit CL. The input and output circuit IO_2 includes a transmitter TX and a receiver RX that are connected in parallel between the core logic circuit CL and the PKG wiring 403.

The host 200 includes a controller chip 201. The transmission line 300 is connected to the controller chip 201. The controller chip 201 includes an input and output circuit IO200 and a core logic circuit CL200. The input and output circuit IO200 includes a transmitter TX and a receiver RX that are connected in parallel between the core logic circuit CL200 and the transmission line 300.

The transmitter TX of the I/F chip 401 and the receiver RX of the controller chip 201 are connected via the transmission line 300. As a result, as illustrated by the single-dotted line in FIG. 1, communication is performed in the route of the memory chip 402→the PKG wiring 403→the receiver RX→the core logic circuit CL→the transmitter TX→the transmission line 300→the receiver RX→the core logic circuit CL200.

The transmitter TX of the controller chip 201 and the receiver RX of the I/F chip 401 are connected via the transmission line 300. As a result, as illustrated by the dotted line in FIG. 1, communication is performed in the route of the core logic circuit CL200→the transmitter TX→the transmission line 300→the receiver RX→the core logic circuit CL→the transmitter TX→the PKG wiring 403→the memory chip 402.

The respective transmitters TX of the input and output circuits IO_1, IO_2, and IO200 may include the semiconductor integrated circuit 1.

When each transmitter TX supports standards such as DDR (Double-Data-Rate), it is desirable to reduce the duty ratio variation because the duty ratio of the data transmitted by each transmitter TX affects the performance of the receiving side.

Figure 2:
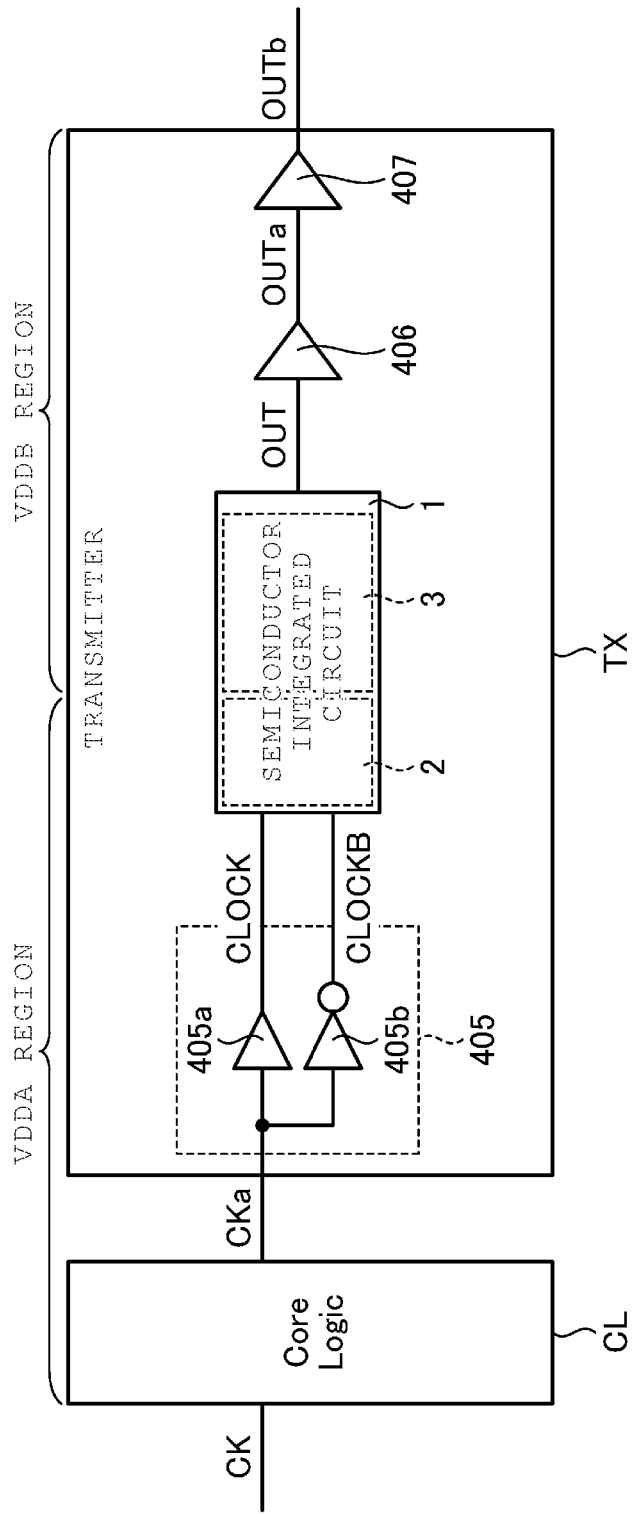
FIG. 2 is a diagram illustrating a configuration of the transmitter including the semiconductor integrated circuit according to the first embodiment.

The transmitter TX may be configured as illustrated in FIG. 2. FIG. 2 is a diagram illustrating a configuration of the transmitter TX including the semiconductor integrated circuit 1. The transmitter TX includes a differentiation circuit 405, the semiconductor integrated circuit 1, a pre-driver 406, and a main driver 407. The differentiation circuit 405 includes a buffer 405a and an inverter 405b. The semiconductor integrated circuit 1 includes a front stage circuit 2 and a rear stage circuit 3.

The semiconductor integrated circuit 1 is connected between the differentiation circuit 405 and the pre-driver 406. The main driver 407 is connected to the pre-driver 406. In the transmitter TX, the differentiation circuit 405 and the front stage circuit 2 in the semiconductor integrated circuit 1 are disposed in a VDDA region operating with a voltage VDDA, which is a power supply voltage. The core logic circuit CL is also provided in the VDDA region. In the transmitter TX, the rear stage circuit 3 in the semiconductor integrated circuit 1, the pre-driver 406, and the main driver 407 are disposed in a VDDB region operating with a voltage VDDB, which is a power supply voltage. The voltage VDDA is lower than the voltage VDDB.

The core logic circuit CL receives data or a clock signal. In the following, a clock is used as an example, but the same applies to data (e.g., a data signal). The core logic circuit CL processes a signal CK and outputs a processed signal CKa. The signal CK is an example of the clock signal.

The semiconductor integrated circuit 1 may be a differential-input and single-output type or a differential-input and differential-output type level shifter circuit. The semiconductor integrated circuit 1 receives signals CLOCK and CLOCKB, which are differential signals differentiated from the signal CKa by the differentiation circuit 405, and outputs a single-ended signal OUT.

The pre-driver 406 transfers the signal OUT to the main driver 407 as a signal OUTa. The main driver 407 outputs the signal OUTa to the outside (for example, transmission line 300) of the transmitter TX as a signal OUTb.

Figure 3:
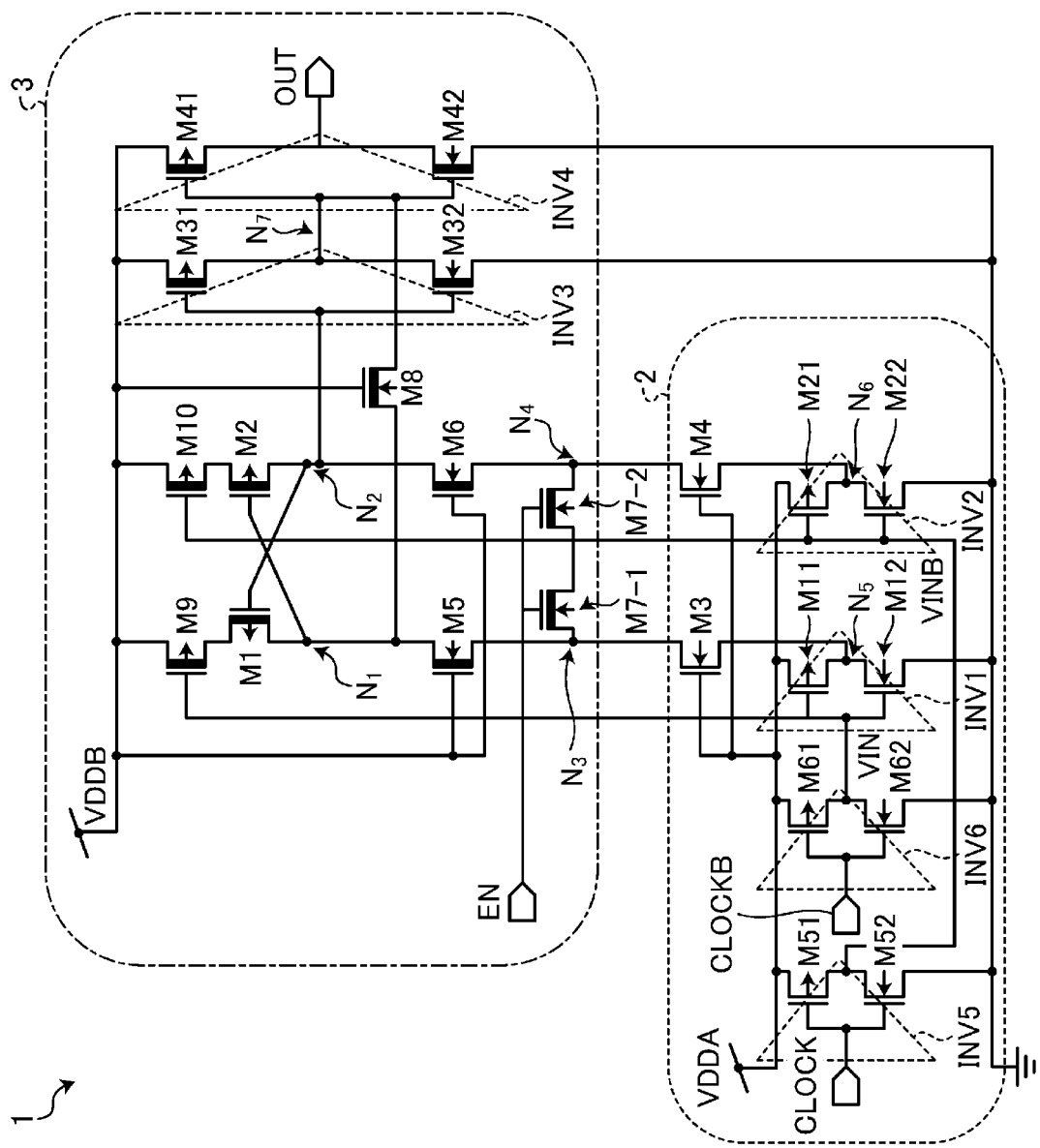
FIG. 3 is a circuit diagram illustrating a configuration of the semiconductor integrated circuit according to the first embodiment.

The semiconductor integrated circuit 1 may be configured as illustrated in FIG. 3. FIG. 3 is a circuit diagram illustrating a configuration of the semiconductor integrated circuit 1.

The semiconductor integrated circuit 1 includes the front stage circuit 2 and the rear stage circuit 3. The front stage circuit 2 is a circuit that operates at the voltage VDDA, which is a power supply voltage. The rear stage circuit 3 is a circuit that operates at the voltage VDDB, which is a power supply voltage. The voltage VDDB is higher than the voltage VDDA. The semiconductor integrated circuit 1 has a configuration in which the front stage circuit 2 and the rear stage circuit 3 are connected in series between a reference voltage (e.g., a ground voltage) and the voltage VDDB. This configuration allows the signals of the front stage circuit 2 to be transmitted to the rear stage circuit 3 at high speed, but there is a possibility that a voltage corresponding to the voltage VDDB is applied to the front stage circuit 2. For that reason, the semiconductor integrated circuit 1 may be a tolerant type level shifter circuit that prevents the voltage VDDB from being applied to transistors in the front stage circuit 2.

The semiconductor integrated circuit 1 receives signals CLOCK and CLOCKB, which are a pair of differential signals, in the front stage circuit 2 and generates signals VIN and VINB, which are differential signals corresponding to the signals CLOCK and CLOCKB, in the front stage circuit 2. When the signals VIN and VINB are transmitted from the front stage circuit 2 to the rear stage circuit 2, the semiconductor integrated circuit 1 converts an H level from a level corresponding to the voltage VDDA to a level corresponding to the voltage VDDB (>VDDA). In this case, the semiconductor integrated circuit 1 converts the H level from the level corresponding to the voltage VDDA to the level corresponding to the voltage VDDB while preventing the voltage VDDB from being directly applied to the transistors in the front stage circuit 2. The semiconductor integrated circuit 1 outputs the signal OUT corresponding to the voltage VDDB from the rear stage circuit 3 to the pre-driver 406. In the description below, a wiring to which the voltage VDDA, which is a power supply voltage, is applied may be denoted as a power supply node VDDA, and a wiring to which the voltage VDDB, which is a power supply voltage, is applied may be denoted as a power supply node VDDB.

The front stage circuit 2 includes an inverter INV5, an inverter INV6, an inverter INV1, an inverter INV2, a transistor M3, and a transistor M4.

The inverter INV5 is connected between the differentiation circuit 405 (see FIG. 2) and the inverter INV2. The inverter INV5 receives the signal CLOCK. The inverter INV5 generates the signal VINB by logically inverting the signal CLOCK, and outputs the generated signal VINB from an output node. The inverter INV5 supplies the signal VINB to the inverter INV2. In the description below, a wiring to which the signal CLOCK is transmitted may be denoted as an input node CLOCK, and a wiring to which the signal VINB is transmitted may be denoted as a node VINB.

The inverter INV5 includes inverter-connected transistors M51 and M52.

The transistor M51 is, for example, a PMOS transistor. The transistor M51 includes a gate connected to the input node CLOCK, a source connected to the power supply node VDDA, and a drain connected to the node VINB.

The transistor M52 is, for example, an NMOS transistor. The transistor M52 includes a gate connected to the input node CLOCK, a source connected to a reference node to which a reference voltage (for example, ground voltage) is applied, and a drain connected to the node VINB.

The inverter INV6 is connected between the differentiation circuit 405 (see FIG. 2) and the inverter INV1. The inverter INV6 receives the signal CLOCKB. The inverter INV6 generates the signal VIN by logically inverting the signal CLOCKB, and outputs the generated signal VIN from an output node. The inverter INV6 supplies the signal VIN to the inverter INV1. In the description below, a wiring to which the signal CLOCKB is transmitted may be denoted as an input node CLOCKB, and a wiring to which the signal VIN is transmitted may be denoted as a node VIN.

The inverter INV6 includes inverter-connected transistors M61 and M62.

The transistor M61 is, for example, a PMOS transistor. The transistor M61 includes a gate connected to the input node CLOCKB, a source connected to the power supply node VDDA, and a drain connected to the node VIN.

The transistor M62 is, for example, an NMOS transistor. The transistor M62 includes a gate connected to the input node CLOCKB, a source connected to the reference node, and a drain connected to the node VIN.

The inverter INV1 is connected between the inverter INV6 and the transistor M3. The inverter INV1 includes an input node that receives the signal VIN. The inverter INV1 generates a signal VIN$^-$ by logically inverting the signal VIN. The inverter INV1 supplies the signal VIN$^-$ from an output node N5 to the transistor M3.

The inverter INV1 includes inverter-connected transistors M11 and M12.

The transistor M11 is, for example, a PMOS transistor. The transistor M11 includes a gate connected to the node VIN, a source connected to the power supply node VDDA, and a drain connected to the node N5.

The transistor M12 is, for example, an NMOS transistor. The transistor M12 includes a gate connected to the node VIN, a source connected to the reference node, and a drain connected to the node N5.

The inverter INV2 is connected between the inverter INV5 and the transistor M4. The inverter INV2 includes an input node that receives the signal VINB. The inverter INV2 generates a signal VINB by logically inverting the signal VINB. The inverter INV2 supplies the signal VINB$^-$ from an output node N6 to the transistor M4.

The inverter INV2 includes inverter-connected transistors M21 and M22.

The transistor M21 is, for example, a PMOS transistor. The transistor M21 includes a gate connected to the node VINB, a source connected to the power supply node VDDA, and a drain connected to the node N6.

The transistor M22 is, for example, an NMOS transistor. The transistor M22 includes a gate connected to the node VINB, a source connected to the reference node, and a drain connected to the node N6.

The transistor M3 is connected between a node N3 and the node N5. The transistor M3 is, for example, an NMOS transistor. The transistor M3 includes a gate to which the power supply node VDDA is input, a source connected to the node N5, and a drain connected to the node N3.

The transistor M4 is connected between a node N4 and the node N6. The transistor M4 is, for example, an NMOS transistor. The transistor M4 includes a gate to which the power supply node VDDA is input, a source connected to the node N6, and a drain connected to the node N4.

The circuit elements in the front stage circuit 2 operate with a power supply voltage VDDA, which is lower than the power supply voltage VDDB. Because of the lower operation voltage, each of the transistors M51, M52, M61, M62, M11, M12, M21, M22, M3, and M4 in the front stage circuit 2 may be configured with a low breakdown voltage transistor.

The low breakdown voltage transistor may be an LVMOS (Low Voltage Metal Oxide Semiconductor) transistor. The low breakdown voltage transistor can be achieved by making a gate insulating film relatively thin. The low breakdown voltage transistor has a relatively low threshold voltage and can be turned on or off appropriately at the voltage VDDA, which is a power supply voltage of the front stage circuit 2.

The rear stage circuit 3 includes a plurality of transistors M7-1 and M7-2, a transistor M5, a transistor M6, a transistor M1, a transistor M2, a transistor M9, a transistor M10, a transistor M8, an inverter INV3, and an inverter INV4.

The plurality of transistors M7-1 and M7-2 are connected in series between the node N3 and the node N4.

The transistor M7-1 is, for example, an NMOS transistor. The transistor M7-1 includes a gate to which an enable signal EN is input, a source (or drain) to which the node N3 is connected, and a drain (or source) to which the transistor M7-2 is connected.

The transistor M7-2 is, for example, an NMOS transistor. The transistor M7-2 includes a gate to which the enable signal EN is input, a source (or drain) to which the transistor M7-1 is connected, and a drain (or source) to which the node N4 is connected.

The enable signal EN transitions from an L level to an H level when the semiconductor integrated circuit 1 starts operating. The H level of the enable signal EN is at a voltage corresponding to the voltage VDDB, which is a power supply voltage of the rear stage circuit 3. As described above, the voltage VDDB is higher than the voltage VDDA, which is the power supply voltage of the front stage circuit 2.

The enable signal EN is at the L level when the semiconductor integrated circuit 1 is on standby, or the like. As a result, compared to the case where the voltage VDDB maintains to be supplied to the gates of the transistors M7-1 and M7-2, the leakage current through the transistors M7-1 and M7-2 during standby of the semiconductor integrated circuit 1 can be reduced and the power consumption of the semiconductor integrated circuit 1 can be reduced.

The number of transistors M7 (M7-1 and M7-2) connected in series between the node N3 and the node N4 may be three or more.

The transistor M5 is connected between a node N1 and the node N3. The transistor M5 is, for example, an NMOS transistor. The transistor M5 includes a gate to which the power supply node VDDB is input, a source to which the transistor M3 is connected via the node N3, and a drain to which the node N1 is connected.

The transistor M6 is connected between a node N2 and the node N4. The transistor M6 is, for example, an NMOS transistor. The transistor M6 includes a gate to which the power supply node VDDB is input, a source to which the transistor M4 is connected via the node N4, and a drain to which the node N2 is connected.

The transistor M1 is disposed between the transistor M9 and the node N1. The transistor M1 is, for example, a PMOS transistor. The transistor M1 is cross-coupled with the transistor M2. The transistor M1 includes a gate connected to a drain of the transistor M2, a source connected to the power supply node VDDB via the transistor M9, and a drain connected to the node N1.

The transistor M2 is disposed between the transistor M10 and the node N2. The transistor M2 is, for example, a PMOS transistor. The transistor M2 is cross-coupled with the transistor M1. The transistor M2 includes a gate connected to the drain of the transistor M1, a source connected to the power supply node VDDB via the transistor M10, and the drain connected to the node N2.

The transistor M9 is disposed between the power supply node VDDB and the transistor M1. The transistor M9 is, for example, a PMOS transistor. A gate of the transistor M9 is connected to the input node of the inverter INV1. The gate of the transistor M9 is commonly connected to the gates of the transistors M11 and M12 of the inverter INV1, respectively. The transistor M9 includes the gate connected to the node VIN, a source connected to the power supply node VDDB, and a drain connected to the node N1 via the transistor M1.

The transistor M10 is disposed between the power supply node VDDB and the transistor M2. The transistor M10 is, for example, a PMOS transistor. A gate of the transistor M10 is connected to the input node of the inverter INV2. The gate of the transistor M10 is commonly connected to the gates of the transistors M21 and M22 of the inverter INV2, respectively. The transistor M10 includes the gate connected to the node VINB, a source connected to the power supply node VDDB, and a drain connected to the node N2 via the transistor M2.

The transistor M8 is connected between the node N1 and the inverter INV4. The transistor M8 is, for example, an NMOS transistor. The transistor M8 includes a gate connected to the power supply node VDDB, a source (or drain) connected to the node N1, and a drain (or source) connected to a node N7. The node N7 is connected to an output node of the inverter INV3 and an input node of the inverter INV4.

The inverter INV3 is disposed between the power supply node VDDB and the reference node. The inverter INV3 is connected between the node N2 and the node N7. The inverter INV3 includes an input node that receives a signal N2 at the node N2. The inverter INV3 generates a signal N2⁻ by logically inverting the signal N2. The inverter INV3 outputs the signal N2⁻ from the output node to the inverter INV4 via the node N7 as a signal N7.

The inverter INV3 includes invert-connected transistors M31 and M32.

The transistor M31 is, for example, a PMOS transistor. The transistor M31 includes a gate connected to the node N2, a source connected to the power supply node VDDA, and a drain connected to the node N7.

The transistor M32 is, for example, an NMOS transistor. The transistor M32 includes a gate connected to the node N2, a source connected to the reference node, and a drain connected to the node N7.

The inverter INV4 is disposed between the power supply node VDDB and the reference node. The inverter INV4 is connected between the node N7 and an output node OUT. The inverter INV4 includes the input node that receives the signal N7 at the node N7. The inverter INV4 generates a signal N7⁻ by logically inverting the signal N7. The inverter INV4 outputs the signal N7⁻ from the output node OUT to the rear stage circuit 3 (for example, pre-driver 406 illustrated in FIG. 2) as a signal OUT.

The inverter INV4 includes inverter-connected transistors M41 and M42.

The transistor M41 is, for example, a PMOS transistor. The transistor M41 includes a gate connected to the node N7, a source connected to the power supply node VDDB, and a drain connected to the output node OUT.

The transistor M42 is, for example, an NMOS transistor. The transistor M42 includes a gate connected to the node N7, a source connected to the reference node, and a drain connected to the output node OUT.

The circuit elements in the rear stage circuit 3 operate with a power supply voltage VDDB, which is higher than the power supply voltage VDDA. Because of the higher power supply voltage, each of the transistors M7-1, M7-2, M5, M6, M1, M2, M9, M10, M8, M31, M32, M41, and M42 in the rear stage circuit 3 may be configured with a high breakdown voltage transistor. In FIG. 3, the gates are illustrated by the bold lines to indicate that each transistor is the high breakdown voltage transistor.

The high breakdown voltage transistor may be an HVMOS (High Voltage Metal Oxide Semiconductor) transistor. The high breakdown voltage transistor can be achieved by making the gate insulating film relatively thick. The high breakdown voltage transistor has a relatively high threshold voltage and can be turned on or off appropriately at the voltage VDDB, which is the power supply voltage of the rear stage circuit 3.

In the semiconductor integrated circuit 1, the voltage VDDB is applied to the gates of the transistors M5 and M6, which are disposed near the boundary with the front stage circuit 2 in the rear stage circuit 3. However, the respective sources of the transistors M5 and M6 may have a voltage lower than the voltage VDDB by the gate-to-source threshold voltage. The voltages of the respective sources are applied to the drains of the transistors M3 and M4, which are disposed near a boundary with the rear stage circuit 3 in the front stage circuit 2. With this configuration, it is possible to prevent the voltage VDDB from being directly applied to the transistors M11, M12, M21, and M22 in the front stage circuit 2.

In addition, the voltage VDDA is applied to the gates of the transistors M3 and M4, which are disposed near the boundary with the rear stage circuit 3 in the front stage circuit 2. The respective sources of the transistors M3 and M4 may have a voltage lower than the voltage VDDA by the gate-to-source threshold voltage. With this configuration, it is possible to prevent the power supply voltage VDDB from being directly applied to the transistors M11, M12, M21, and M22 in the front stage circuit 2.

In other words, by connecting the high breakdown voltage transistor M5 and the low breakdown voltage transistor M3 in multiple stages between node N1 and node N5, it is possible to prevent the voltage VDDB from being directly applied to node N5. Similarly, by connecting the high breakdown voltage transistor M6 and the low breakdown voltage transistor M4 in multiple stages between the node N2 and the node N6, it is possible to prevent the voltage VDDB from being directly applied to the node N6.

Figure 8:
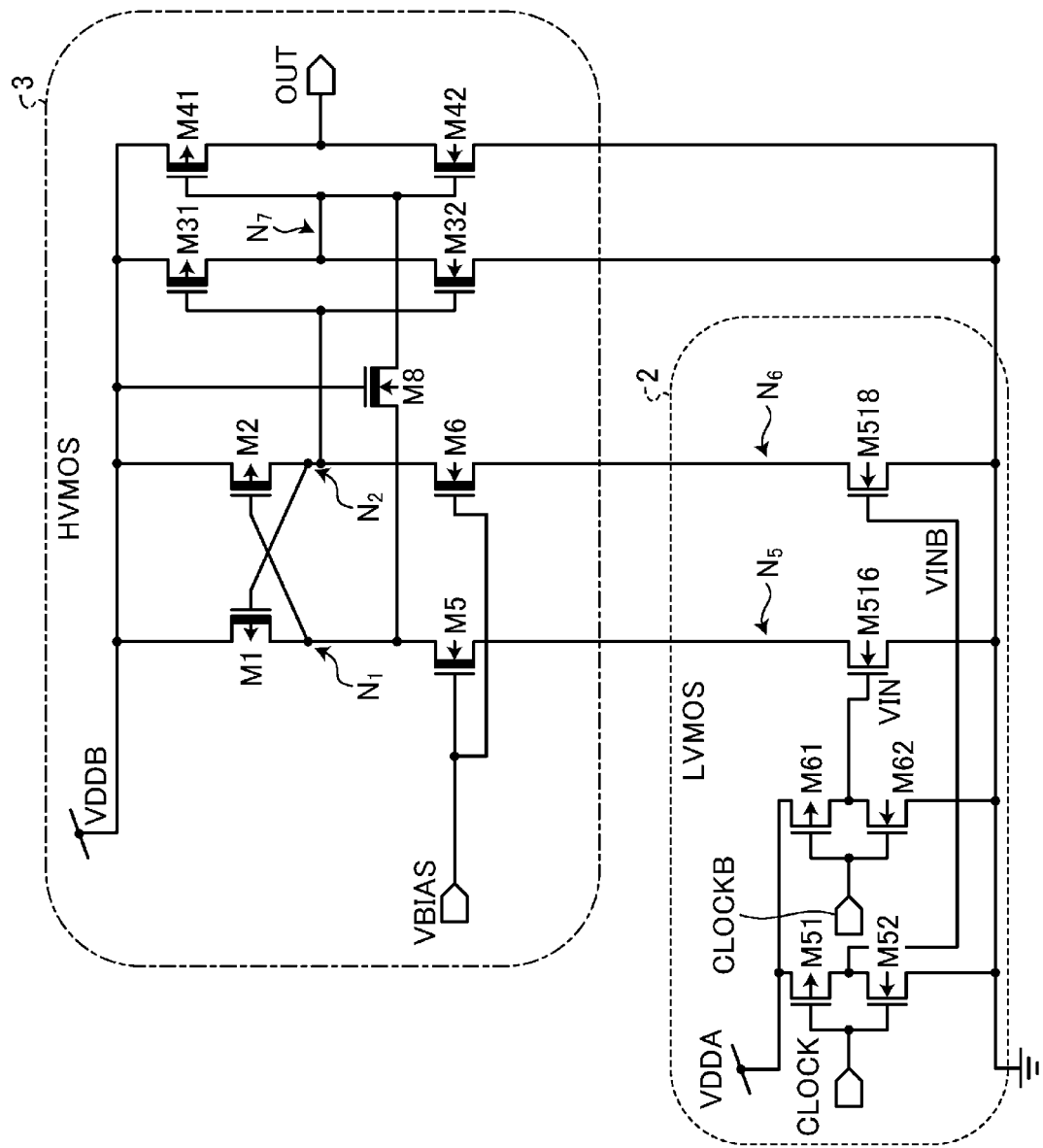
FIG. 8 is a circuit diagram illustrating a configuration of a semiconductor integrated circuit according to a first comparative example.
Figure 9:
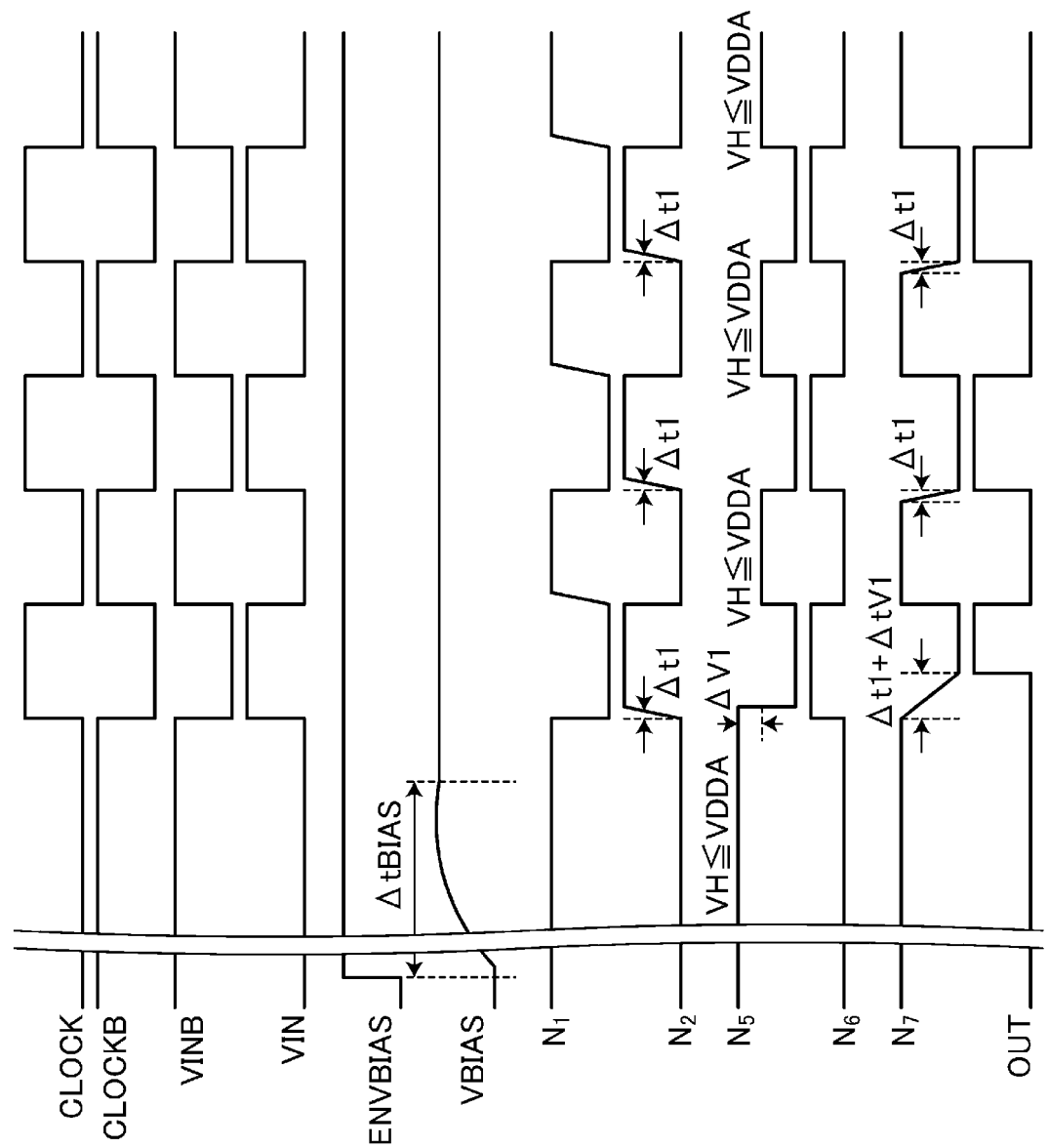
FIG. 9 is a waveform diagram illustrating an operation of the semiconductor integrated circuit according to the first comparative example.

For example, as illustrated in FIG. 8, a configuration of a first comparative example can be considered in which a bias voltage VBIAS of an intermediate voltage between the voltage VDDA and the voltage VDDB is generated and supplied to each gate of the transistors M5 and M6. The configuration of the first comparative example includes some of the configurations of the first embodiment illustrated in FIG. 3. In the configuration of the first comparative example, as illustrated in FIG. 9, at the start of the operation, a stabilization period ΔtBIAS is provided from the start of supplying the bias voltage VBIAS until the transistors M5 and M6 are stabilized. Therefore, there is a problem that communication is not possible during the stabilization period ΔtBIAS. In the case of FIG. 9, transmission of the signals CLOCK and CLOCKB is started after the stabilization period ΔtBIAS elapses.

In contrast, in the semiconductor integrated circuit 1, the voltage VDDB is supplied to the gates of the transistors M5 and M6, and voltage VDDA is supplied to the gates of the transistors M3 and M4, and thus, the stabilization period ΔtBIAS is not necessary, and the startup time can be improved.

For example, in the configuration of the first comparative example illustrated in FIG. 8, the signal VIN is received at a gate of an NMOS transistor M516 and the signal VINB is received at a gate of an NMOS transistor M518. In the configuration of the first comparative example, the NMOS transistor M516 has a source connected to the ground voltage and a drain connected to the node N5. The NMOS transistor M518 has a source connected to the ground voltage and a drain connected to the node N6. In the configuration of the first comparative example, as illustrated in FIG. 9, one of the signal VIN and the signal VINB is at an L level at the start of the operation after the stabilization period ΔtBIAS elapses, and thus, one of the transistor M516 and the transistor M518 turns off. FIG. 9 illustrates the case in which the signal VIN is at the L level and the transistor M516 turns off. When the transistor M516 turns off, a line between the node N5 and the node N1 is in a floating state and a voltage between the node N5 and the node N1 becomes unstable, and thus, it tends to transition to a desired level in the first cycle of the signal VIN with a delay instead of immediately. This results in a smaller pulse width in the first cycle of the signal, which makes the duty ratio smaller than 50%. Therefore, when the signal is a clock, there is a possibility that incorrect data values are latched due to insufficient setup time or hold time when latching data in synchronization with a first clock in a circuit at an output destination of the signal.

In contrast, in the semiconductor integrated circuit 1, the inverter INV1 receives the signal VIN, the inverter INV2 receives the signal VINB, and the plurality of transistors M7-1 and M7-2 are connected between the nodes N3 and N4. In the semiconductor integrated circuit 1, one of the signal VIN and the signal VINB is at the L level at the start of the operation, and thus, one of the inverter INV1 and the inverter INV2 outputs the H level. When the inverter INV1 outputs the H level, the line between the node N5 and the node N1 is at an H level corresponding to the power supply voltage VDDA. Further, the nodes N3 and N4 are connected through on-resistance of the plurality of transistors M7-1 and M7-2. As a result, the voltage of the line between the node N5 and the node N1 is stabilized, and thus, an immediate transition to a desired level is possible in the first cycle of the signal. As a result, the pulse width of the first cycle of the signal can be sufficiently wide and the duty ratio can be maintained at about 50%. Therefore, when the signal is a clock, the setup time or hold time when latching data in synchronization with the first clock in the circuit at the output destination of the signal can be sufficiently long, thereby preventing the incorrect data values from being latched.

Furthermore, for example, in the configuration of the first comparative example illustrated in FIG. 8, the transistor M8 is omitted. In the configuration of the first comparative example, the signal N2 at the node N2 rises from an L level to an H level at a slower speed than a speed at which the signal N2 falls from the H level to the L level. Therefore, the signal N7 as an output of the inverter INV3, which receives the signal N2, falls from an H level to an L level at a slower speed than a speed at which the signal N7 rises from the L level to the H level. As a result, the signal OUT as an output of the inverter INV4, which receives the signal N7, has a smaller pulse width, which makes the duty ratio smaller than 50%. Therefore, when the signal is a clock, there is a possibility that the incorrect data values are latched due to insufficient setup time or hold time when latching data in synchronization with the clock in the circuit at the output destination of the signal.

In contrast, in the semiconductor integrated circuit 1, the transistor M8 transmits a signal N1 at the node N1 to the node N7. The signal N1 is a signal with the opposite polarity to the signal N2 and falls from an H level to an L level at a faster speed than a speed at which the signal N1 rises from the L level to the H level. Therefore, the signal N7 obtained by synthesizing the output of the inverter INV3 and the signal N1 can fall from the H level to the L level at a faster speed. As a result, the signal OUT as the output of the inverter INV4, which receives the signal N7, can ensure a pulse width and maintain the duty ratio of about 50%. Therefore, when the signal to be processed in the semiconductor integrated circuit 1 is a clock, the setup time or hold time when latching data in synchronization with the clock in the circuit at the output destination of the signal can be sufficiently long, thereby preventing the incorrect data values from being latched.

Figure 4:
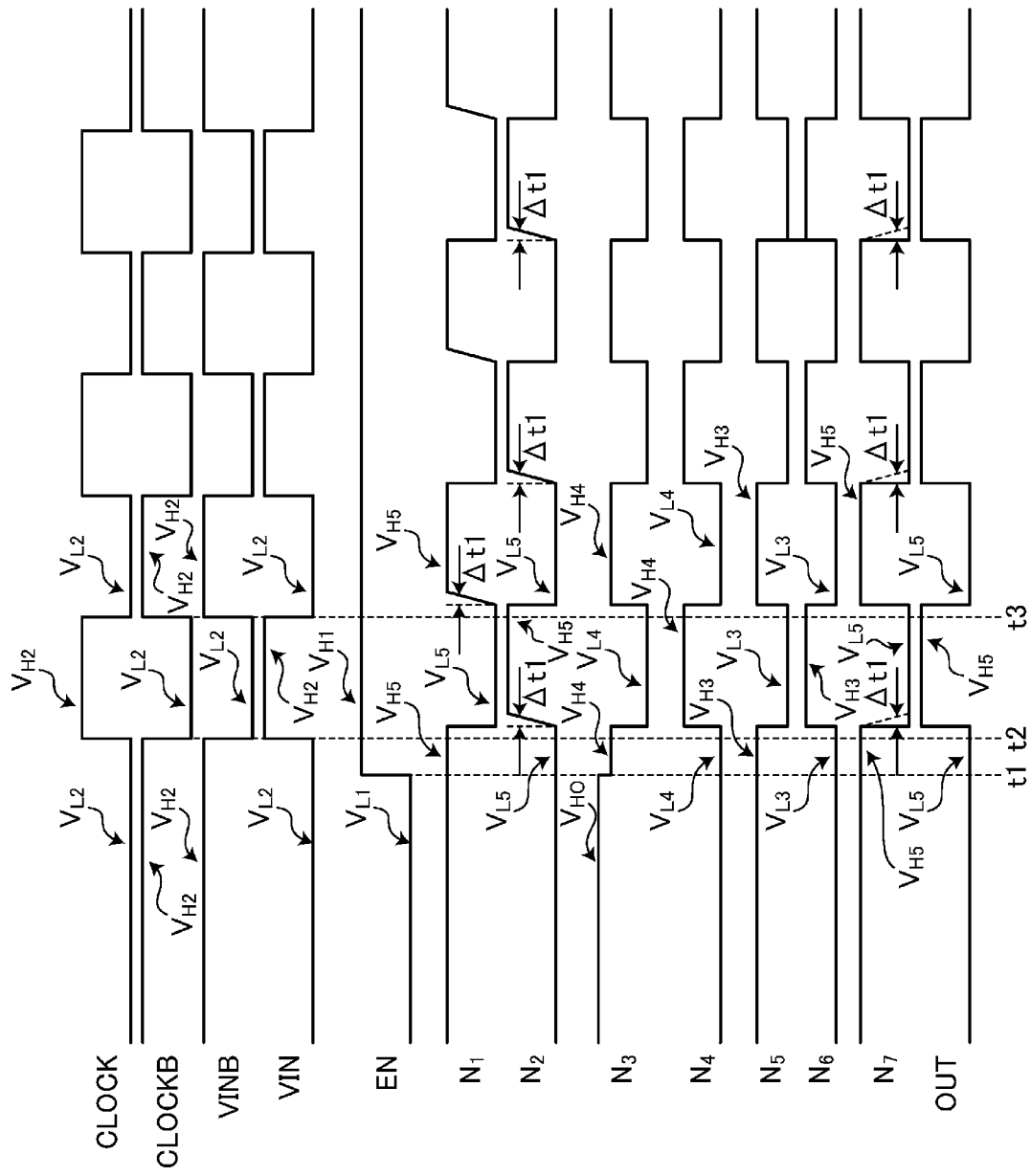
FIG. 4 is a waveform diagram illustrating an operation of the semiconductor integrated circuit according to the first embodiment.

Next, an operation of the semiconductor integrated circuit 1 will be described with reference to FIG. 4. FIG. 4 is a waveform diagram illustrating the operation of the semiconductor integrated circuit 1.

Immediately before timing t1, the signal CLOCK is at an L level VL2 and the logically inverted signal VINB is at an H level VH2. The signal CLOCKB is at the H level VH2, and the logically inverted signal VIN is at the L level VL2. The L level VL2 may be at the ground voltage and the H level VH2 may be at a voltage corresponding to the voltage VDDA.

A voltage of the node N5 corresponding to logic inversion of the signal VIN is an H level VH3, and a voltage of the node N6 corresponding to the logic inversion of the signal VINB is an L level VL3. The L level VL3 may be at the ground voltage and the H level VH3 may be at a voltage corresponding to the voltage VDDA.

At this time, since the source is at the H level VH3 although the voltage VDDA is supplied to the gate, the transistor M3 is maintained in an OFF state. The transistor M5 is maintained in an ON state by the voltage VDDB supplied to the gate thereof, and a line between the drain of the transistor M3 and the node N1 is in a floating state. The transistors M7-1 and M7-2 are maintained in a disable state by the L level VL1 supplied to the gates thereof. As a result, a voltage of the node N3 is at an unstable level VH0.

Meanwhile, the transistor M4 is maintained in an ON state because the voltage VDDA is supplied to the gate and the source is at the L level VL3. The transistor M6 is maintained in an ON state by the voltage VDDB supplied to the gate thereof. A voltage of the node N4 is at a stable L level VL4. The L level VL4 has a ground voltage. A voltage of the node N2 is at an L level VL5. Accordingly, a voltage of the node N1 is at an H level VH5. The L level VL5 may have the ground voltage and the H level VH5 may have a voltage corresponding to the voltage VDDB.

At timing t1, the enable signal EN transitions from the L level VL1 to an H level VH1. The L level VL1 may have the ground voltage and the H level VH1 may have a voltage corresponding to the voltage VDDB. Accordingly, the transistors M7-1 and M7-2 are maintained in an ON state, respectively, and the node N3 and the node N4 are connected through the series connection of the on-resistance of the transistors M7-1 and M7-2. As a result, the voltage of the node N3 is slightly pulled down to the L level VL4 side of the node N4 through the on-resistance of the transistors M7-1 and M7-2, and becomes a stable H level VH4. The H level VH4 may have a voltage corresponding to the voltage VDDA.

Here, the high breakdown voltage transistor M5 and the low breakdown voltage transistor M3 are connected in multiple stages between the node N1 and the node N5, and the high breakdown voltage transistor M6 and the low breakdown voltage transistor M4 are connected in multiple stages between the node N2 and the node N6. The voltage VDDB is applied to the gates of the transistors M5 and M6, and the voltage VDDA is applied to the gates of the transistors M3 and M4. This eliminates the need for a bias having an intermediate voltage between the power supply voltage VDDA and the power supply voltage VDDB, and thus, a period of time for stabilizing the bias is also not necessary.

Due to this multistage connection structure, when the transistors M3 and M5 are maintained in the ON state, the voltage at the node N1 is divided by the on-resistance of the transistor M5 and the on-resistance of the transistor M3. When the transistors M4 and M6 are maintained in the ON state, the voltage at the node N2 is divided by the on-resistance of the transistor M6 and the on-resistance of the transistor M4. As a result, the voltage value of the line between the nodes N5 and N3 and the voltage value of the line between the nodes N6 and N4 vary in a range of 0 to ≈VDDA, respectively, so that the low breakdown voltage transistor (for example, LVMOS) in the front stage circuit 2 has no reliability problems.

For example, at timing t2, the signal CLOCKB transitions from the H level VH2 to the L level VL2, and the logically inverted signal VIN transitions from the L level VL2 to the H level VH2. The voltage of the node N5 corresponding to the logic inversion of the signal VIN transitions from the H level VH3 to the L level VL3. Accordingly, the transistor M3 turns on and the voltage of the node N3 transitions from the H level VH4 to the L level VL4. The voltage of the node N1 transitions from the H level VH5 to the L level VL5.

Meanwhile, the signal CLOCK transitions from the L level VL2 to the H level VH2, and the logically inverted signal VINB transitions from the H level VH2 to the L level VL2. The voltage of the node N6 corresponding to the logic inversion of the signal VINB transitions from the L level VL3 to the H level VH3. Accordingly, the transistor M4 turns off. The line between the drain of the transistor M4 and the node N2 is in a floating state. Therefore, the voltage of the node N2 rises in Δt1 time with a time constant delay and transitions from the L level VL5 to the H level VH5.

Here, the voltage of the node N2 is logically inverted by the inverter INV3 and transferred to the node N7, and the voltage of the node N1 is transferred to the node N7 with the same logic by the transistor M8. As a result, the voltage of the node N7 falls more steeply than Δt1 time and transitions from the H level VH5 to the L level VL5. As a result, the logically inverted signal OUT rises more steeply than Δt1 time and transitions from the L level VL5 to the H level VH5.

At timing t3, the signal CLOCK transitions from the H level VH2 to the L level VL2, and the logically inverted signal VINB transitions from the L level VL2 to the H level VH2. The voltage of the node N6 corresponding to the logic inversion of the signal VINB transitions from the H level VH3 to the L level VL3. Accordingly, the transistor M4 turns on and the voltage of the node N4 transitions from the H level VH4 to the L level VL4. The voltage of the node N2 transitions from the H level VH5 to the L level VL5.

Meanwhile, the signal CLOCKB transitions from the L level VL2 to the H level VH2, and the logically inverted signal VIN transitions from the H level VH2 to the L level VL2. The voltage of the node N5 corresponding to the logic inversion of the signal VIN transitions from the L level VL3 to the H level VH3. Accordingly, the transistor M3 turns off. The line between the drain of the transistor M3 and the node N1 is in a floating state. Therefore, the voltage of the node N1 rises in Δt1 time with a time constant delay and transitions from the L level VL5 to the H level VH5.

Here, the voltage of the node N2 is logically inverted by the inverter INV3 and transferred to the node N7, and the voltage of the node N1 is transferred to the node N7 with the same logic by the transistor M8. As a result, the voltage of the node N7 rises more steeply than Δt1 time and transitions from the L level VL5 to the H level VH5. As a result, the logically inverted signal OUT falls more steeply than Δt1 time and transitions from the H level VH5 to the L level VL5.

Thereafter, the operation at timing t2 and the operation at timing t3 are alternately repeated.

As described above, according to the first embodiment, in the semiconductor integrated circuit 1, the high breakdown voltage transistor M5 and the low breakdown voltage transistor M3 are connected in multiple stages between the node N1 and the node N5, and the high breakdown voltage transistor M6 and the low breakdown voltage transistor M4 are connected in multiple stages between the node N2 and the node N6. The voltage VDDB is applied to the gates of the transistors M5 and M6, and the voltage VDDA is applied to the gates of the transistors M3 and M4. As a result, it is possible to prevent the voltage VDDB from being directly applied to the transistors M11, M12, M21, and M22 in the front stage circuit 2 without using a bias having an intermediate voltage between the voltage VDDA and the voltage VDDB. As a result, a period of time for stabilizing the bias is not necessary, and it is possible to prevent a voltage from being applied to the low breakdown voltage transistors M11, M12, M21, and M22 in the front stage circuit 2. Therefore, the semiconductor integrated circuit 1 can operate faster, and the reliability can be guaranteed.

In the first embodiment, the semiconductor integrated circuit 1, the inverter INV1 receives the signal VIN, the inverter INV2 receives the signal VINB, and the plurality of transistors M7-1 and M7-2 are connected between the nodes N3 and N4. As a result, the voltage of the node N3 or the node N4, which is in a floating state, can be stabilized and the pulse width of the first cycle of the output signal OUT can be secured and the duty ratio can be maintained at about 50%. Therefore, when the signal to be processed in the semiconductor integrated circuit 1 is a clock, the setup time or hold time when latching data in synchronization with the first clock in the circuit at the output destination of the signal can be sufficiently long, thereby preventing the incorrect data values from being latched.

In the first embodiment, in the semiconductor integrated circuit 1, the transistor M8 transmits the signal N1 at the node N1 to the node N7. As a result, the signal N7 obtained by synthesizing the output of the inverter INV3 and the signal N1 can fall from the H level to the L level at a faster speed, so that the pulse width of the first cycle of the signal OUT to be output can be secured and the duty ratio can be maintained at about 50%. Therefore, when the signal to be processed in the semiconductor integrated circuit 1 is a clock, the setup time or hold time when latching data in synchronization with the first clock in the circuit at the output destination of the signal can be sufficiently long, thereby preventing the incorrect data values from being latched.

Figure 5:
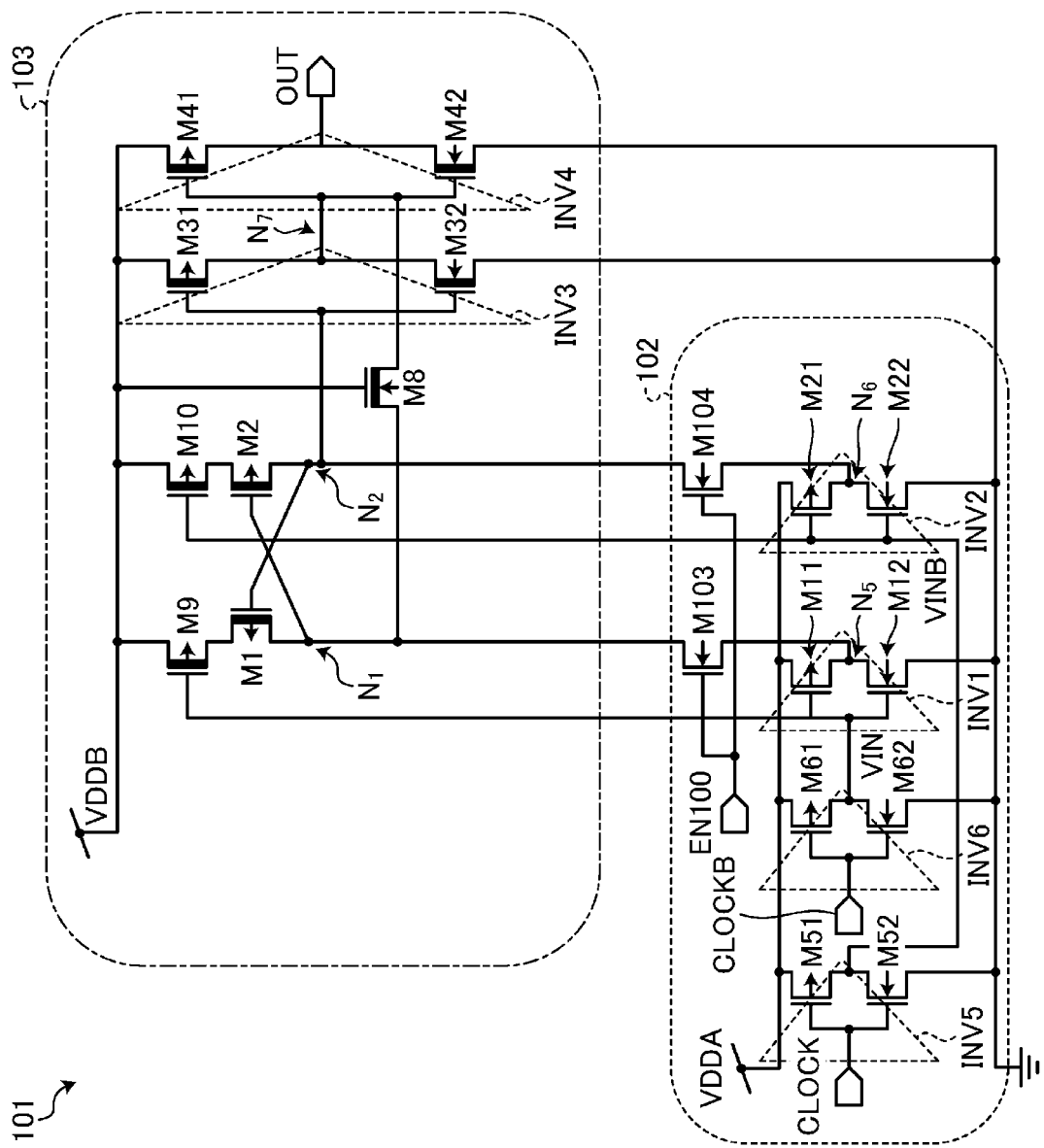
FIG. 5 is a circuit diagram illustrating a configuration of a semiconductor integrated circuit according to a modification of the first embodiment.

As a modification of the first embodiment, a semiconductor integrated circuit 101 may be configured as illustrated in FIG. 5. FIG. 5 is a circuit diagram illustrating a configuration of the semiconductor integrated circuit 101 according to the modification of the first embodiment.

The semiconductor integrated circuit 101 includes a front stage circuit 102 and a rear stage circuit 103 instead of the front stage circuit 2 and the rear stage circuit 3 (see FIG. 3). The front stage circuit 102 includes a transistor M103 and a transistor M104 instead of the transistor M3 and the transistor M4 (see FIG. 3). In the rear stage circuit 103, the plurality of transistors M7-1 and M7-2, the transistor M5, and the transistor M6 (see FIG. 3) are omitted.

The transistor M103 and the transistor M104 are basically the same as the transistor M3 and the transistor M4 in the first embodiment (see FIG. 3), but differ in that the transistor M103 and the transistor M104 include gates to which an enable signal EN100 is supplied. The enabled signal EN100 may have a waveform similar to the enable signal EN and may transition from the L level VL2 to the H level VH2 at timing t1 (see FIG. 4). The enable signal EN100 differs from the enable signal EN in that the H level VH2 has a voltage corresponding to the voltage VDDA.

For example, in each of the transistor M103 and the transistor M104, the configuration illustrated in FIG. 5 may be used if the drain-to-substrate voltage VDB is about the voltage VDDB, the drain-to-source voltage VDS is about the voltage VDDA, and the operation is possible without reliability problems.

Thus, in the semiconductor integrated circuit 101, it is possible to prevent the voltage VDDB from being directly applied to the transistors M11, M12, M21, and M22 in the front stage circuit 102 while the configuration of the rear stage circuit 103 is simplified. As a result, the reliability of the semiconductor integrated circuit 101 can be improved while reducing the cost.

Second Embodiment

Next, a semiconductor integrated circuit according to a second embodiment will be described. In the following, the description will be made focusing on the parts that are different from the first embodiment.

While a configuration in which the semiconductor integrated circuit 1 is a tolerant type level shifter circuit is used as an example in the first embodiment, a semiconductor integrated circuit 201 according to the second embodiment is an example of a non-tolerant type level shifter circuit.

Figure 6:
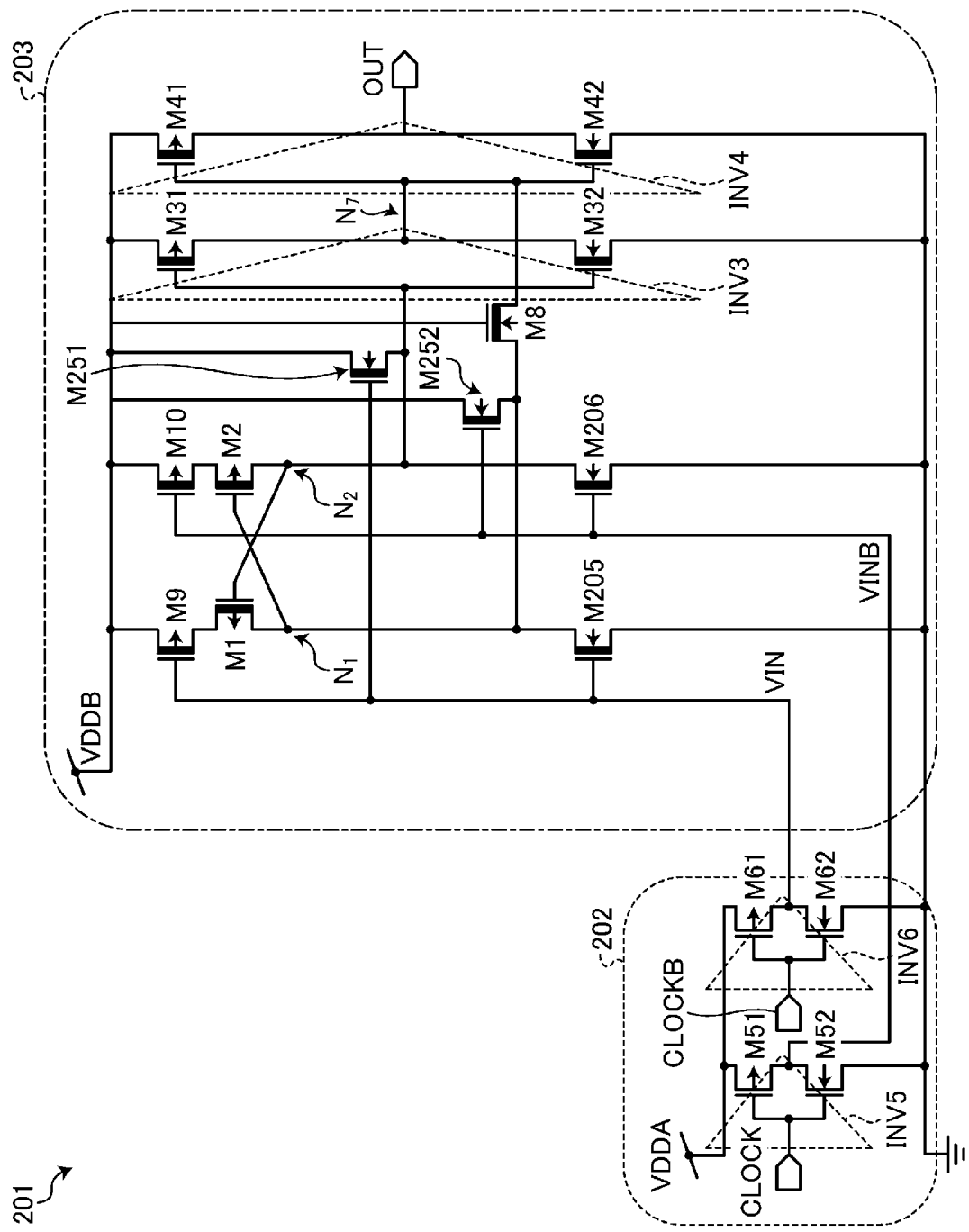
FIG. 6 is a circuit diagram illustrating a configuration of a semiconductor integrated circuit according to a second embodiment.

The semiconductor integrated circuit 201 may be configured as illustrated in FIG. 6. FIG. 6 is a circuit diagram illustrating a configuration of the semiconductor integrated circuit 201 according to the second embodiment.

The semiconductor integrated circuit 201 includes a front stage circuit 202 and a rear stage circuit 203. In the semiconductor integrated circuit 201, the front stage circuit 202 and the rear stage circuit 203 are not connected in series between a ground voltage and a voltage VDDB, which is a power supply voltage with respect to the rear stage circuit 203. The front stage circuit 202 and the rear stage circuit 203 are connected in parallel between a side of input nodes CLOCK and CLOCKB and a side of an output node OUT. The front stage circuit 202 is disposed between the ground voltage and a voltage VDDA, which is a power supply voltage, and the rear stage circuit 203 is disposed between the ground voltage and the voltage VDDB, which is a power supply voltage. In the present embodiment, the voltage VDDB is higher than the voltage VDDA. The semiconductor integrated circuit 201 may be configured as a non-tolerant type that does not include a configuration to mitigate the voltage applied to the transistors in the front stage circuit 202 since there is little concern about the voltage VDDB being applied to the front stage circuit 202. In the description below, a wiring to which the voltage VDDB, which is a power supply voltage, is applied may be denoted as a power supply node VDDB, a wiring to which a signal VIN is transmitted may be denoted as a node VIN, and a wiring to which a signal VINB is transmitted may be denoted as a node VINB.

In the front stage circuit 202, the inverter INV1, the inverter INV2, the transistor M3, and the transistor M4 (see FIG. 3) are omitted from the configuration of the semiconductor integrated circuit 1 according to the first embodiment.

The rear stage circuit 203 includes a transistor M205 and a transistor M206 instead of the transistor M5 and the transistor M6 (see FIG. 3) with respect to the configuration of the semiconductor integrated circuit 1 according to the first embodiment, and the plurality of transistors M7-1 and M7-2 (see FIG. 3) are omitted, and further a transistor M251 and a transistor 252 are further included.

The transistor M205 is inverter-connected to the transistor M9 via the transistor M1. The transistor M205 is connected between the node N1 and the ground voltage. The transistor M205 is, for example, an NMOS transistor. The transistor M205 includes a gate to which the signal VIN is input, a source connected to a reference node to which a reference voltage (for example, ground voltage) is applied, and a drain connected to the node N1. The gate of the transistor M9 and the gate of the transistor M205 are commonly connected to the output node of INV6.

The transistor M206 is inverter-connected to the transistor M10 via the transistor M2. The transistor M206 is connected between the node N2 and the ground voltage. The transistor M206 is, for example, an NMOS transistor. The transistor M206 includes a gate to which the signal VINB is input, a source connected to the reference node, and a drain connected to the node N2. The gate of the transistor M10 and the gate of the transistor M206 are commonly connected to the output node of INV5.

The transistor M251 is disposed between the node N2 and the power supply node VDDB. The transistor M251 is connected between the node VIN and the node N2. The transistor M251 is, for example, an NMOS transistor. The transistor M251 includes a gate to which the signal VIN is input, a source connected to the node N2, and a drain connected to the power supply node VDDB.

The transistor M252 is disposed between the node N1 and the power supply node VDDB. The transistor M252 is connected between the node VINB and the node N1. The transistor M252 is, for example, an NMOS transistor. The transistor M252 includes a gate to which the signal VINB is input, a source connected to the node N1, and a drain connected to the power supply node VDDB.

Figure 10:
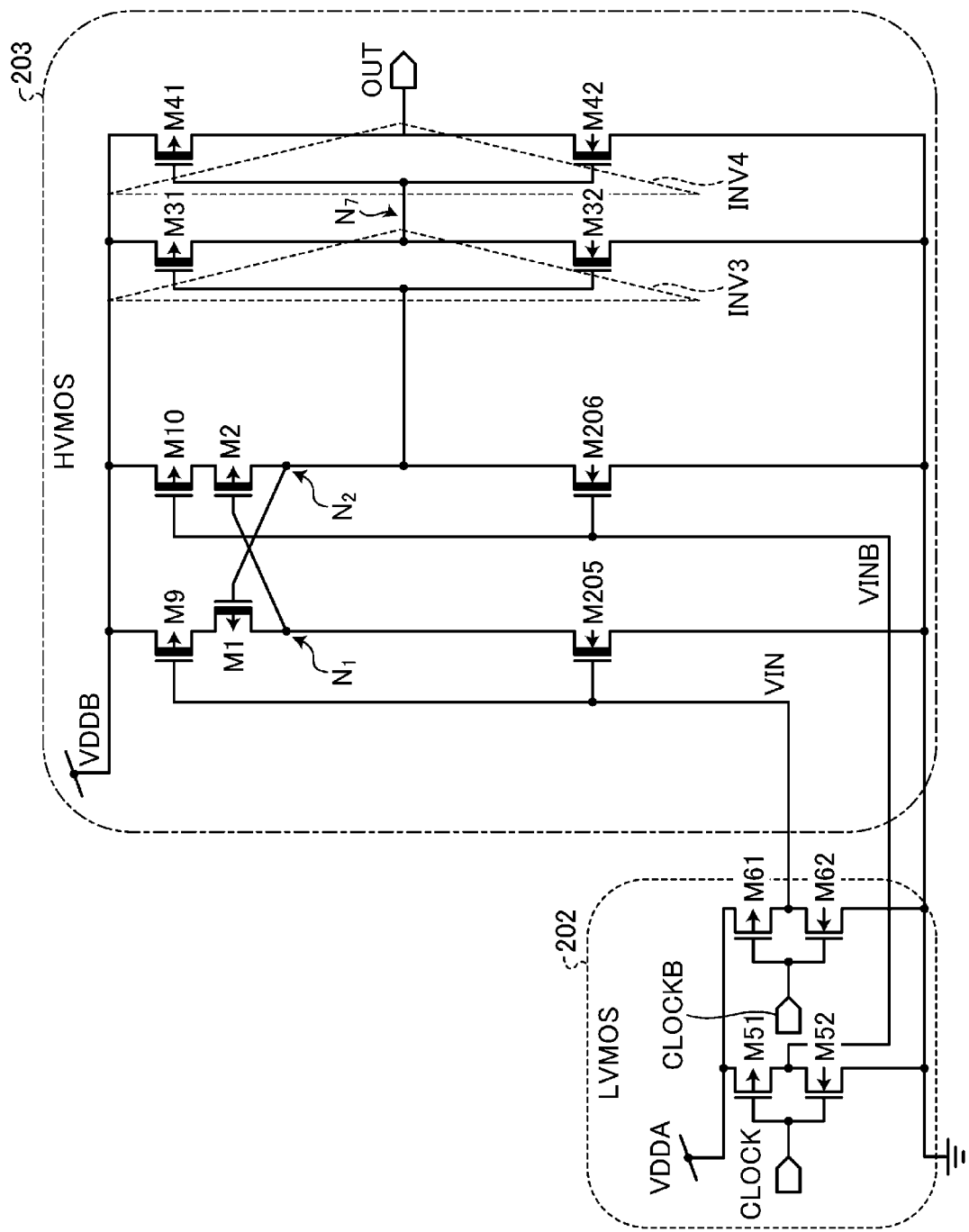
FIG. 10 is a circuit diagram illustrating a configuration of a semiconductor integrated circuit according to a second comparative example.

For example, in a configuration of a second comparative example illustrated in FIG. 10, the transistors M252, M251, and M8 (see FIG. 6) are omitted. In the configuration of the second comparative example, as illustrated in FIG. 11, when the signal VIN or the signal VINB transitions from the H level to the L level, the coupling between the gate and drain of the transistors M206 and M205 that receive the signal causes the levels of the nodes N2 and N1 on the drain side thereof to be temporarily pulled from the L level to an even lower level and then transition to the H level. As a result, the voltages of the nodes N2 and N1 rise in Δt2 time with a delay and transition from the L level to the H level. As a result, the signal N7 obtained by logically inverting the signal at the node N2 by the inverter INV3 falls in Δt2 time with a delay. The signal OUT as the output of the inverter INV4, which receives the signal N7, has a smaller pulse width, which makes the duty ratio smaller than 50%. Therefore, when the signal is a clock, there is a possibility that incorrect data values are latched due to insufficient setup time or hold time when latching data in synchronization with a clock in a circuit at an output destination of the signal.

Figure 7:
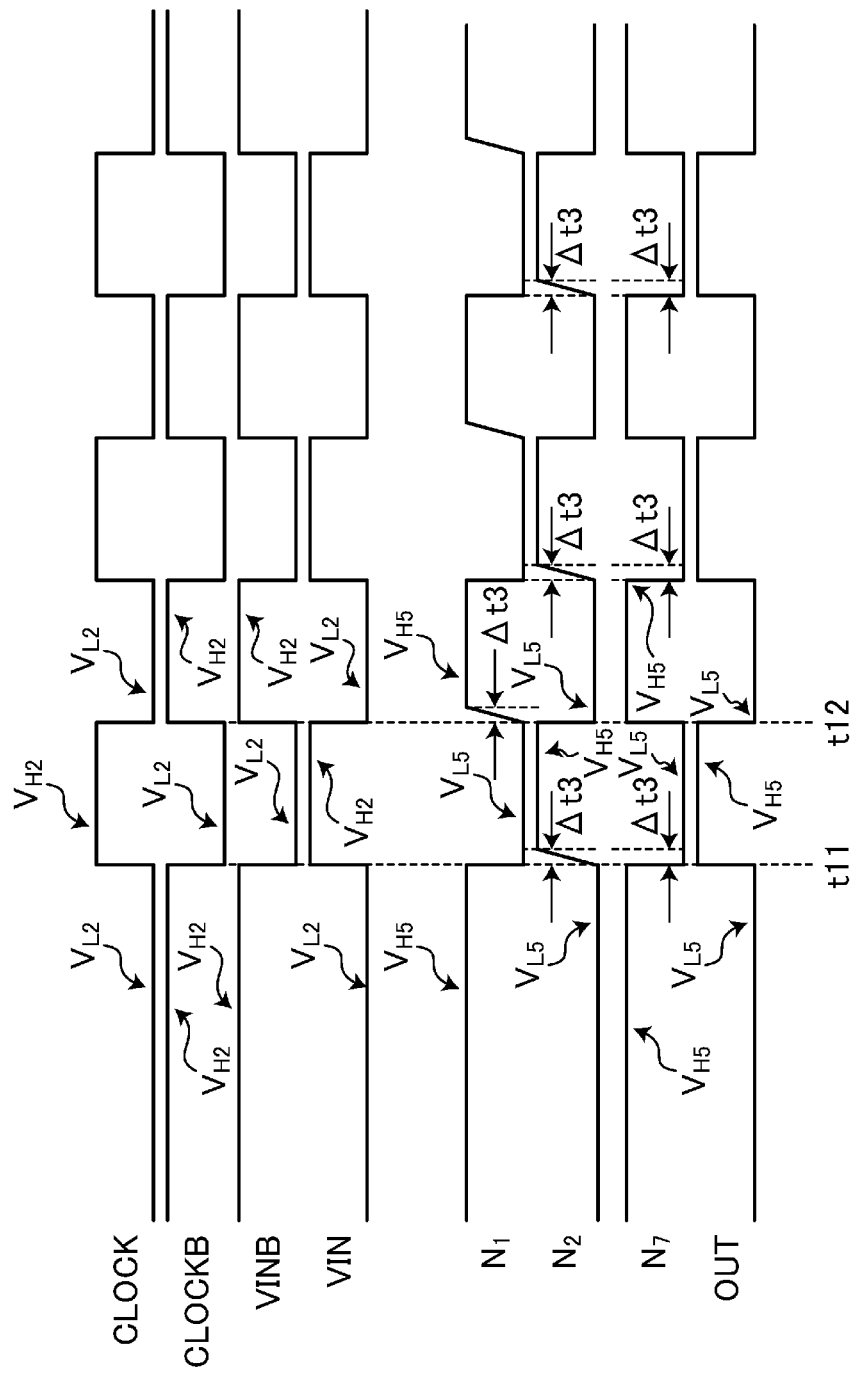
FIG. 7 is a waveform diagram illustrating an operation of the semiconductor integrated circuit according to the second embodiment.

In contrast, in the semiconductor integrated circuit 201, operations of the transistors M252 and M251 illustrated in FIG. 6 can improve the delay in the rise at the level transition of the nodes N1 and N2, respectively, as illustrated in FIG. 7. The operation of the transistor M8 illustrated in FIG. 6 can improve the delay in the fall of the voltage of the node N7, as illustrated in FIG. 7. Therefore, when the signal to be processed in the semiconductor integrated circuit 201 is a clock, the setup time or hold time when latching data in synchronization with the clock in the circuit at the output destination of the signal can be sufficiently secured, thereby preventing the incorrect data values from being latched.

For example, at timing t11 illustrated in FIG. 7, the voltage of the node N2 starts to transition from the L level VL5 to the H level VH5. Also, the signal VIN transitions from the L level VL2 to the H level VH2. Accordingly, the transistor M251 turns on and connects the node N2 to the voltage VDDB, and the voltage of the node N2 rises. This can speed up the transition of the voltage of the node N2 from the L level VL5 to the H level VH5.

For example, at timing t12 illustrated in FIG. 7, the voltage of the node N1 starts to transition from the L level VL5 to the H level VH5. Also, the signal VINB transitions from the L level VL2 to the H level VH2. Accordingly, the transistor M252 turns on and connects the node N1 to the voltage VDDB, and the voltage of the node N1 rises. This can speed up the transition of the voltage of the node N1 from the L level VL5 to the H level VH5.

The operations of the transistors M252 and M251 can improve the delay in the rise at the level transition of the nodes N1 and N2, respectively.

The delay in the fall of the voltage of the node N7 can be improved by shorting the fast fall of the node N1 and the node N7 with the transistor M8, which is the same as in the first embodiment.

For example, at timing t11 illustrated in FIG. 7, the voltage of the node N2 is logically inverted by the inverter INV3 and transferred to the node N7, and the voltage of the node N1 is transferred to the node N7 with the same logic by the transistor M8. As a result, the voltage of the node N7 rises more steeply than Δt3 time and transitions from the H level VH5 to the L level VL5. As a result, the logically inverted signal OUT thereof rises more steeply than Δt3 time and transitions from the L level VL5 to the H level VH5.

As described above, in the second embodiment, in the semiconductor integrated circuit 201, the operations of the transistors M252 and M251 can improve the delay in the rise at the level transition of the nodes N1 and N2, respectively. The operation of the transistor M8 can improve the delay in the fall of the voltage of the node N7. As a result, the pulse width of the first cycle of the output signal OUT can be secured and the duty ratio can be maintained at about 50%. Therefore, when the signal to be processed in the semiconductor integrated circuit 201 is a clock, the setup time or hold time when latching data in synchronization with the clock in the circuit at the output destination of the signal can be sufficiently secured, thereby preventing the incorrect data values from being latched.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
   a first inverter between a first power supply node at a first power supply voltage and a reference node at a reference voltage, and having a first input node configured to receive a first signal;
   a second inverter between the first power supply node and the reference node, and having a second input node configured to receive a second signal, which is an inverted signal of the first signal;
   a first transistor between a second power supply node at a second power supply voltage higher than the first power supply voltage and a first node;
   a second transistor between the second power supply node and a second node, a drain of the second transistor being connected to a gate of the first transistor and a gate of the second transistor being connected to a drain of the first transistor;
   a third transistor between the first node and the first inverter, and having a gate connected to the first power supply node;
   a fourth transistor between the second node and the second inverter, and having a gate connected to the first power supply node;
   a fifth transistor between the first node and the third transistor, and having a gate connected to the second power supply node;
   a sixth transistor between the second node and the fourth transistor, and having a gate connected to the second power supply node; and
   a plurality of seventh transistors connected in series between a third node between the third and fifth transistors and a fourth node between the fourth and sixth transistors, each of the seventh transistors having a gate configured to receive a signal at a third voltage, wherein
   a breakdown voltage of each of the third and fourth transistors is lower than that of the first, second, fifth, sixth, and seventh transistors.

2. The semiconductor integrated circuit according to claim 1, further comprising:
   a third inverter between the second power supply node and the reference node, and having a third input node connected to the second node;

a fourth inverter between the second power supply node and the reference node, and having a fourth input node connected to an output of the third inverter; and an eighth transistor between the first node and the fourth inverter, and having a gate connected to the second power supply node, wherein the breakdown voltage of each of the third and fourth transistors is lower than that of the eighth transistor.

3. The semiconductor integrated circuit according to claim 1, wherein a thickness of a gate insulating film of each of the third and fourth transistors is less than that of a gate insulating film of the first, second, fifth, sixth, and seventh transistors.

4. The semiconductor integrated circuit according to claim 1, wherein the first signal is a clock signal or a signal based on the clock signal.

5. The semiconductor integrated circuit according to claim 1, wherein the first signal is a data signal or a signal based on the data signal.

6. A transmitter comprising:
the semiconductor integrated circuit according to claim 1; and
a first circuit configured to receive a signal output by the semiconductor integrated circuit, and process the received signal.

7. A semiconductor device comprising:
an interface circuit that includes the transmitter according to claim 6;
a bus that is connected to the interface circuit; and
electronic components that are connected to the interface circuit via the bus.

8. The semiconductor integrated circuit according to claim 1, wherein the third voltage is a voltage of an enable signal.

9. The semiconductor integrated circuit according to claim 8, wherein the voltage of the enable signal at a high level corresponds to the second power supply voltage.

* * * * *